US011430596B2

(12) United States Patent
Sakamoto et al.

(10) Patent No.: US 11,430,596 B2
(45) Date of Patent: Aug. 30, 2022

(54) TEMPERATURE REGULATING DEVICE FOR MAGNETIC CIRCUIT COMPONENT

(71) Applicant: DENSO CORPORATION, Kariya (JP)

(72) Inventors: Akira Sakamoto, Kariya (JP); Naoya Kondo, Kariya (JP)

(73) Assignee: DENSO CORPORATION, Kariya (JP)

( * ) Notice: Subject to any disclaimer, the term of this patent is extended or adjusted under 35 U.S.C. 154(b) by 1039 days.

(21) Appl. No.: 16/080,030

(22) PCT Filed: Feb. 10, 2017

(86) PCT No.: PCT/JP2017/004936
§ 371 (c)(1),
(2) Date: Aug. 27, 2018

(87) PCT Pub. No.: WO2017/159150
PCT Pub. Date: Sep. 21, 2017

(65) Prior Publication Data
US 2019/0066899 A1    Feb. 28, 2019

(30) Foreign Application Priority Data

Mar. 17, 2016  (JP) ................................. 2016-053787

(51) Int. Cl.
*F24F 3/14* (2006.01)
*H01F 27/10* (2006.01)
(Continued)

(52) U.S. Cl.
CPC ............ *H01F 27/10* (2013.01); *H01F 27/24* (2013.01); *H02M 1/32* (2013.01);
(Continued)

(58) Field of Classification Search
USPC .......................................................... 165/205
See application file for complete search history.

(56) References Cited

U.S. PATENT DOCUMENTS 6,795,780 B1* 9/2004 Hyde ..................... F15B 19/00
702/50
8,350,516 B2* 1/2013 Takeuchi ................ H02P 29/02
361/23
(Continued)

FOREIGN PATENT DOCUMENTS

JP     2013-051848 A    3/2013
JP     2013051848 A  *  3/2013

*Primary Examiner* — Claire E Rojohn, III
(74) *Attorney, Agent, or Firm* — Posz Law Group, PLC

(57) ABSTRACT

A temperature regulating device regulates temperature of the magnetic circuit component incorporated in a power converter and including a magnetic core and a coil wound around the magnetic core and includes a cooling device that cools the magnetic circuit component, a temperature estimation device that estimates a temperature of the magnetic circuit component, a target temperature determination device that determines a target temperature of the magnetic circuit component, at which a loss of the magnetic circuit component is lowered, based on a relationship between temperature and loss of the magnetic circuit component, and a cooling suppressor that, when the temperature of the magnetic circuit component estimated by the temperature estimation device is equal to or lower than a predetermined temperature lower than the target temperature, suppresses the cooling of the magnetic circuit component by the cooling device so that the temperature of the magnetic circuit component reaches the target temperature.

8 Claims, 17 Drawing Sheets

(51) Int. Cl.
    *H02M 7/5387*      (2007.01)
    *H05K 7/20*      (2006.01)
    *H01F 27/24*      (2006.01)
    *H02M 1/32*      (2007.01)
    *H02M 1/00*      (2006.01)

(52) U.S. Cl.
    CPC .... *H02M 7/53875* (2013.01); *H05K 7/20927* (2013.01); *H05K 7/20945* (2013.01); *H02M 1/007* (2021.05); *H02M 1/0048* (2021.05); *H02M 1/327* (2021.05)

(56) References Cited

U.S. PATENT DOCUMENTS

| | | | | |
|---|---|---|---|---|
| 8,669,789 | B2* | 3/2014 | Tsukada | H03K 17/0828 |
| | | | | 327/108 |
| 11,139,753 | B2* | 10/2021 | Ikeda | H02M 7/53871 |
| 2010/0008113 | A1* | 1/2010 | Kuno | H03K 17/166 |
| | | | | 363/95 |
| 2014/0045669 | A1* | 2/2014 | Osawa | B04B 15/02 |
| | | | | 494/9 |
| 2014/0245783 | A1* | 9/2014 | Proud | A44C 5/0015 |
| | | | | 63/1.11 |
| 2015/0168880 | A1* | 6/2015 | Jota | G03G 15/2053 |
| | | | | 399/333 |
| 2016/0016171 | A1* | 1/2016 | Goel | B01L 7/52 |
| | | | | 435/7.1 |
| 2016/0045841 | A1* | 2/2016 | Kaplan | C01B 32/05 |
| | | | | 429/49 |
| 2016/0116925 | A1* | 4/2016 | Freeman | H02M 1/36 |
| | | | | 307/130 |
| 2017/0099011 | A1* | 4/2017 | Freeman | H02M 7/06 |
| 2017/0127480 | A1* | 5/2017 | Hadoulias | F24H 3/022 |
| 2017/0146936 | A1* | 5/2017 | Eguchi | G03G 15/2057 |
| 2018/0033536 | A1* | 2/2018 | Nishi | H01F 27/255 |
| 2018/0072182 | A1* | 3/2018 | Araki | B60L 58/15 |
| 2018/0128155 | A1* | 5/2018 | Yoshida | F01P 7/14 |
| 2019/0066899 | A1* | 2/2019 | Sakamoto | H02M 1/32 |
| 2019/0273437 | A1* | 9/2019 | Tano | H02M 3/1584 |
| 2020/0133254 | A1* | 4/2020 | Celia | G05B 19/4185 |
| 2020/0212670 | A1* | 7/2020 | Butler | H01H 9/542 |
| 2020/0225655 | A1* | 7/2020 | Cella | G05B 23/0264 |
| 2020/0274375 | A1* | 8/2020 | Griffiths | H02J 7/0029 |
| 2020/0361281 | A1* | 11/2020 | Williams | B60H 1/00385 |
| 2020/0362808 | A1* | 11/2020 | Cosgrove | B60H 1/322 |
| 2020/0378352 | A1* | 12/2020 | Cosgrove | B60W 10/06 |
| 2020/0379393 | A1* | 12/2020 | Nakazawa | H02H 1/06 |
| 2020/0391611 | A1* | 12/2020 | Nobumoto | B60K 1/04 |

* cited by examiner

TEMP. CHARACTERISTICS OF
MnZn BASED FERRITE
(LOSS=1 AT 20°C)

TEMPERATURE REGULATING DEVICE FOR MAGNETIC CIRCUIT COMPONENT

CROSS REFERENCE TO RELATED APPLICATIONS

This application is a U.S. national phase of International Application No. PCT/JP2017/004936 filed on Feb. 10, 2017 and is based on Japanese Patent Application No. 2016-053787 filed on Mar. 17, 2016, the disclosures of which are incorporated herein by reference.

TECHNICAL FIELD

The present disclosure relates to a temperature regulating device for a magnetic circuit component, the device being incorporated in a power converter and regulating a temperature of the magnetic circuit component including a magnetic core and a coil wound around the magnetic core.

BACKGROUND ART

For example, a drive unit called a power control unit to control the drive of an electric motor is mounted over a hybrid automobile having both an internal combustion engine and an electric motor as driving sources, an automobile having an electric motor as a driving source, or the like. As a power control unit of this kind, there is a unit configured by incorporating a power converter such as an inverter device or a DC-DC converter of a large capacity into a case (for example, refer to Patent Document 1).

On this occasion, a cooling device for cooling a component acting as a heat source such as a power module or a reactor including a switching element is arranged particularly in components constituting a power converter. As such a cooling device, disclosed in Patent Document 1 is a configuration of installing a first cooling device of a lamination type arranged in the manner of interposing a plurality of power modules and a second cooling device spliced to a reactor. In the configuration, such a circulation is performed that introduces a refrigerant (water) from a refrigerant supply device into the first cooling device through a pipe, introduces the refrigerant discharged from the first cooling device into the second cooling device, and returns the refrigerant discharged from the second cooling device to the refrigerant supply device.

PRIOR ART DOCUMENT

Patent Document

Patent Document 1: JP 2013-51848 A

SUMMARY OF INVENTION

Meanwhile, various kinds of materials of a ferrite base, an Fe—Si—Al alloy base, an amorphous base, and the like are adopted for a magnetic core constituting a reactor as a magnetic circuit component and it is known that power loss varies with temperature although it also varies with an adopted material. In recent studies, it is indicated that the loss of a reactor increases at a low temperature and comes to be lowest at about 80° C. to 100° C. that is slightly lower than a heat resistant temperature.

Consequently, at the time of start-up during winter season or the like for example, the temperature of a reactor is 10° C. or lower sometimes, power loss is comparatively large at such a temperature, and to raise a temperature promptly is rather advantageous in respect of loss reduction. That is, at a low temperature, a magnetic core of a magnetic circuit component becomes more efficient by not applying cooling but rather attempting to raise the temperature. In a cooling device of Patent Document 1 however, since cooling is applied always similarly to a power module and a reactor, it sometimes happens undesirably that the cooling device is operated in a state where the power loss of the reactor is large.

It is an objective of the present disclosure to provide a temperature regulating device for a magnetic circuit component capable of suppressing the power loss of a magnetic circuit to a comparatively low level.

A temperature regulating device for a magnetic circuit component in a first aspect of the present disclosure regulates temperature of the magnetic circuit component that is incorporated in a power converter and includes a magnetic core and a coil wound around the magnetic core and includes a cooling device that cools the magnetic circuit component, a temperature estimation device that estimates a temperature of the magnetic circuit component, a target temperature determination device that determines a target temperature of the magnetic circuit component, at which a loss of the magnetic circuit component is lowered, based on a relationship between temperature and loss of the magnetic circuit component, and a cooling suppressor that, when the temperature of the magnetic circuit component estimated by the temperature estimation device is equal to or lower than a predetermined temperature lower than the target temperature, suppresses the cooling of the magnetic circuit component by the cooling device so that the temperature of the magnetic circuit component reaches the target temperature.

Here, in a temperature characteristic of a magnetic circuit component showing a relationship between a temperature and a loss, although the temperature characteristic differs with the material of a magnetic core, the loss increases comparatively at a low temperature and the loss comes to be lowest for example at about 80° C. to 100° C. that is slightly lower than a heat resistant temperature (refer to FIGS. 6A and 6B).

According to the above configuration, the magnetic circuit component that is incorporated in the power converter is cooled by the cooling device. The target temperature determination device determines the target temperature, at which the loss is lowered. When the temperature of the magnetic circuit component estimated by the temperature estimation device is equal to or lower than a predetermined temperature lower than the target temperature, the cooling suppressor suppresses the cooling of the magnetic circuit component by the cooling device so that the temperature of the magnetic circuit component reaches the target temperature.

By suppressing cooling therefore, it is possible to: raise a temperature to a target temperature promptly; and resultantly suppress the power loss of a magnetic circuit to a comparatively low level.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION (1) First Embodiment

Figure 2:
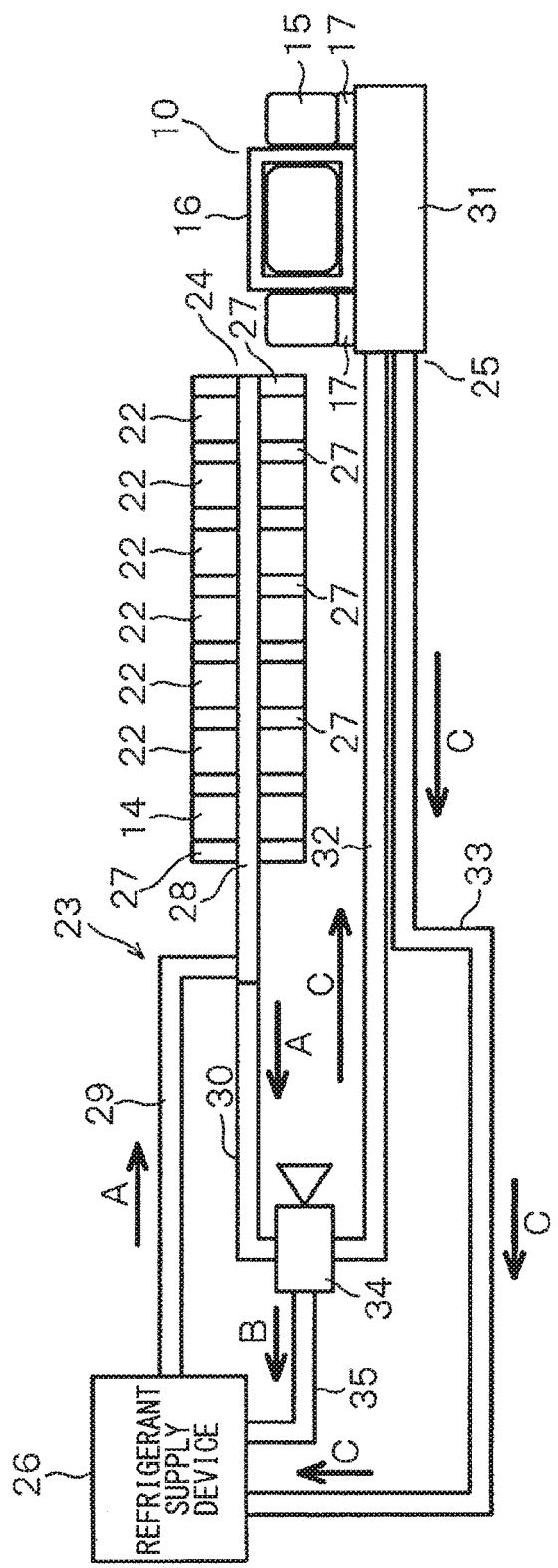
FIG. 2 is a view schematically showing a configuration of a cooling device.
Figure 3:
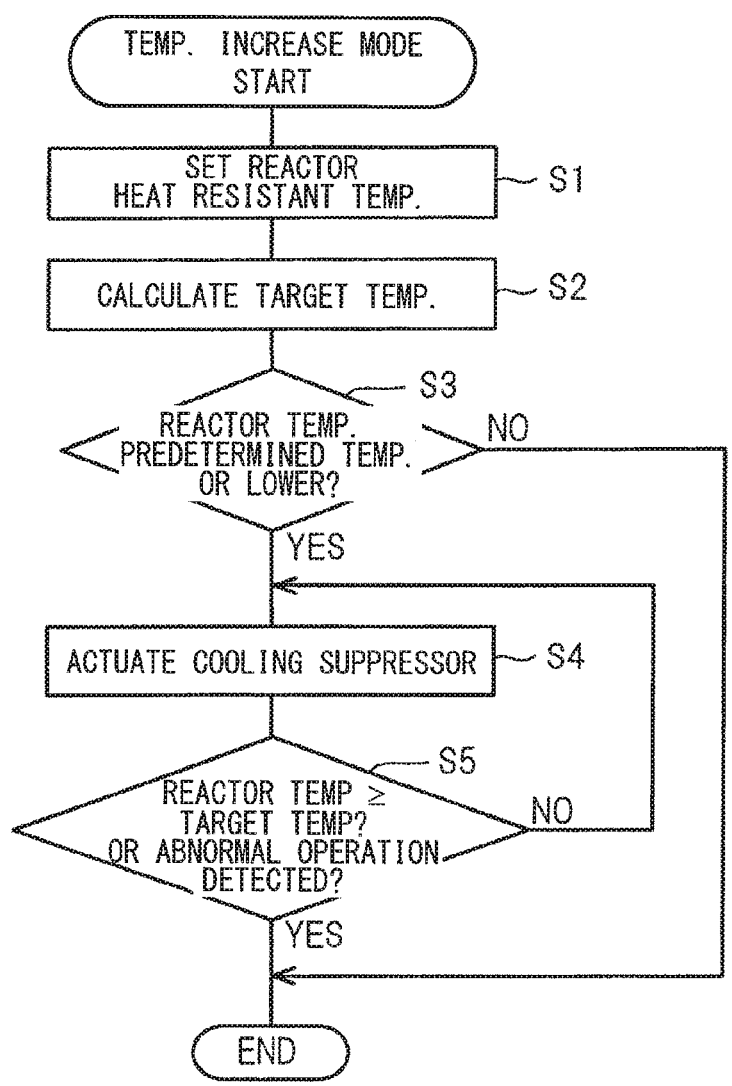
FIG. 3 is a flowchart showing control procedures for a cooling suppressor.
Figure 4:
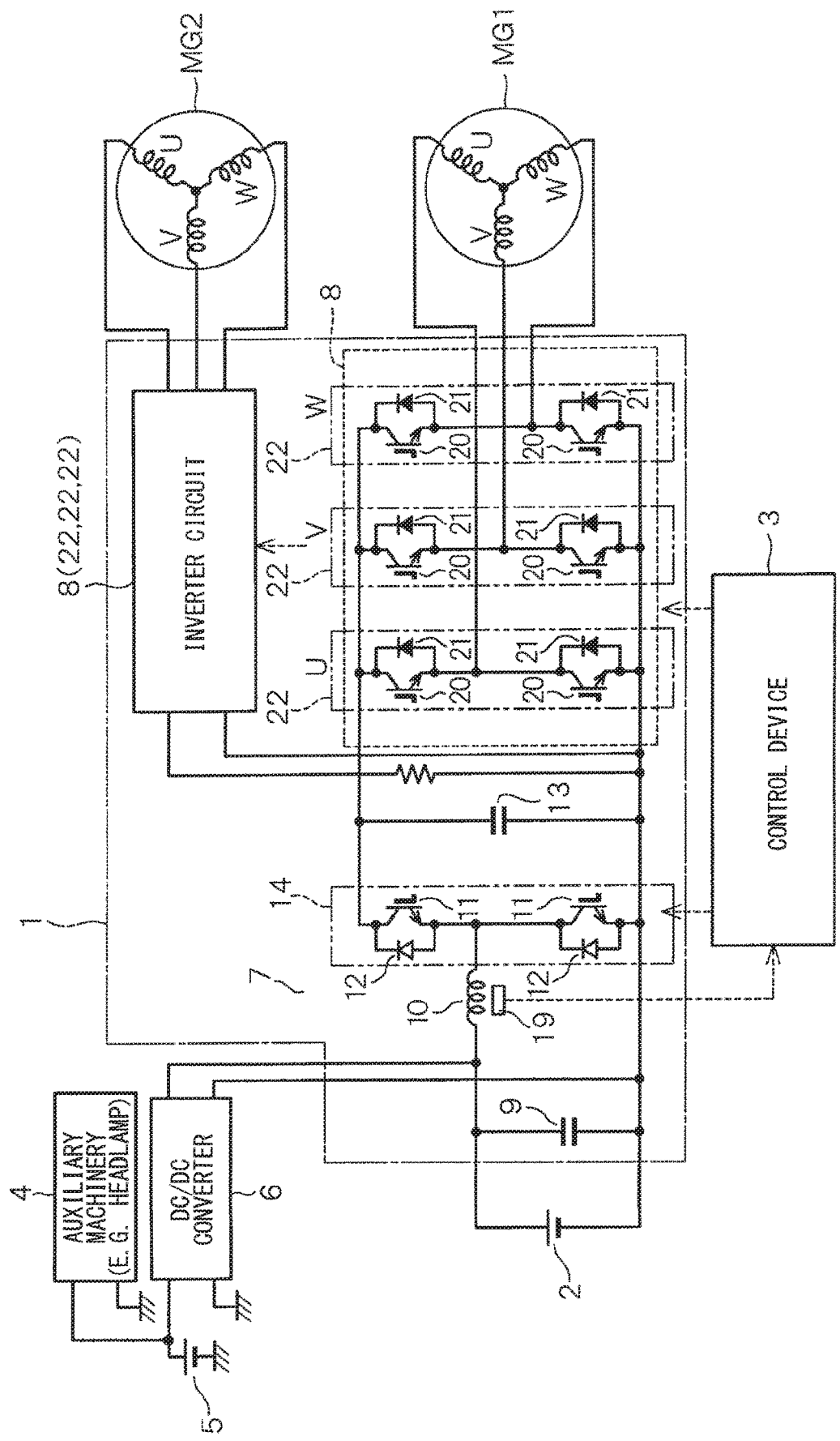
FIG. 4 is a view schematically showing an overall circuit configuration of a power control unit.

A first embodiment is explained hereunder in reference to FIGS. 1 to 7B. Here, the embodiments stated below are based on the case of applying the present disclosure to an inverter device mounted over a hybrid car. FIG. 4 schematically shows an overall circuit configuration of a drive unit called a power control unit in a hybrid car. The drive unit includes an inverter device 1 as a power converter according to the present embodiment for driving a motor-generator.

Here, in a hybrid car, two motor-generators MG1 and MG2 for traveling and power generating are arranged and also an HV battery 2 for a power source and a control device 3 to control the inverter device 1 and the like are arranged. Further, auxiliary machinery (automobile electrical equipment) 4 such as a headlamp, a battery 5 for the auxiliary machinery, a DC-DC converter 6 for driving the auxiliary machinery, and the like are also arranged. Here, the voltage of the HV battery 2 is set at 201.6 V for example and the voltage of the battery 5 for the auxiliary machinery is set at 12 V for example. The DC-DC converter 6 converts a DC high voltage of the HV battery 2 into a low voltage (for example, 14 V), supplies the low voltage to the auxiliary machinery 4, and charges the battery 5 for the auxiliary machinery.

The inverter device 1 has a booster converter 7 to boost the voltage of the HV battery 2 to at most 650 V for example. With this, the inverter device 1 has two sets of three-phase inverter circuits 8 and 8 to convert the boosted DC voltage into three-phase AC and drive the motor-generators MG1 and MG2. The booster converter 7 and the inverter circuits 8 and 8 are controlled by the control device 3.

Among those, the booster converter 7 has an input condenser 9, a reactor 10, two switching elements 11 and 11 such as IGBTs, diodes 12 and 12 connected to the switching elements 11 and 11 respectively in anti-parallel, and an output condenser 13. On this occasion, as shown also in FIG. 2, the two sets of the switching elements 11 and 11 and the diodes 12 and 12 are configured as a semiconductor module 14 molded into a thin package. A cooling plate comprising a metal such as aluminum, copper, or the like is arranged over both the surfaces or one surface of the package although the details are not shown in the figure.

Figure 5:
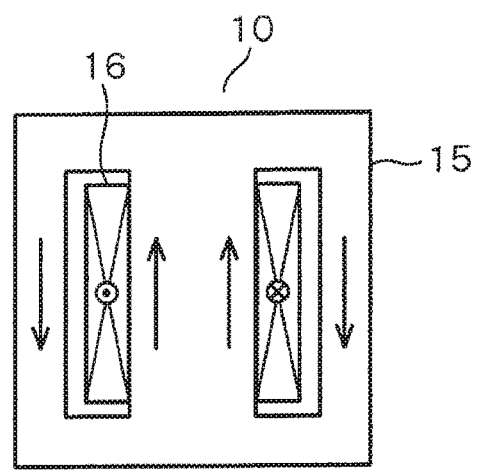
FIG. 5 is a sectional view schematically showing a reactor.

As shown in FIGS. 5 and 2, the reactor 10 includes an EE-shaped magnetic core 15 having two winding gaps and a coil 16 wounded in the adjacent winding gaps for example. When an electric current flows in the coil 16 in the direction shown in FIG. 5, a magnetic flux of a closed magnetic circuit shown by the arrow in the figure is generated in the magnet core 15. A pair of terminals of the coil 16 are extracted to the exterior and connected to another electric element although that is not shown in the figures.

Here, materials adoptable as the magnetic core 15 are as follows. For example, an Fe—Si alloy, an Fe—Si—Al alloy, an amorphous Fe, a magnetic core comprising compressed or non-compressed powder of an Fe—Si alloy, a magnetic core comprising compressed or non-compressed powder of an Fe—Si—Al alloy, a magnetic core comprising compressed or non-compressed powder of an amorphous Fe, a ferrite, and a laminated iron core can be adopted. Further, as shown schematically in FIG. 2, the bottom of the reactor 10 is thermally connected to a cooling plate 31 that will be described later with an insulating layer 17 several microns to several millimeters in thickness interposed. The insulating layer 17 comprises a heat radiation resin including a filler enhancing thermal conductivity in the resin. A configuration of containing a reactor 10 in a metal case is also acceptable.

Then a temperature sensor 19 (refer to FIGS. 1 and 4) such as a thermistor for example for detecting the temperature of the interior of the reactor 10 is arranged in the reactor 10. As the temperature sensor 19, a sensor such as a thermocouple or a platinum resistance thermometer can be used other than a thermistor. The temperature sensor 19 can be arranged: over the surface or in the interior of the magnetic core 15 in the reactor 10; over the surface of the reactor 10 including the coil 16; or in the interior of the reactor 10. Otherwise, a configuration of detecting a temperature in a vicinity of the reactor 10 and estimating a temperature of the reactor 10 from the temperature is also acceptable.

As it is well known, each inverter circuit 8 includes six switching elements 20 such as IGBTs or the like and six diodes 21 connected to the switching elements 20 in antiparallel respectively. On this occasion, with regard to each of the phases of U, V, and N, a circuit formed by connecting in series parallel-connected circuits constituting upper and lower arms each of which includes a switching element 20 and a diode 21 is provided as a semiconductor module 22 (refer to FIG. 2). Although a detailed figure is omitted, each semiconductor module 22 is configured by molding two sets of switching elements 20 and diodes 21 in a thin package. In addition, a cooling plate comprising a metal is arranged over both the surfaces or one surface of the package.

Figure 1:
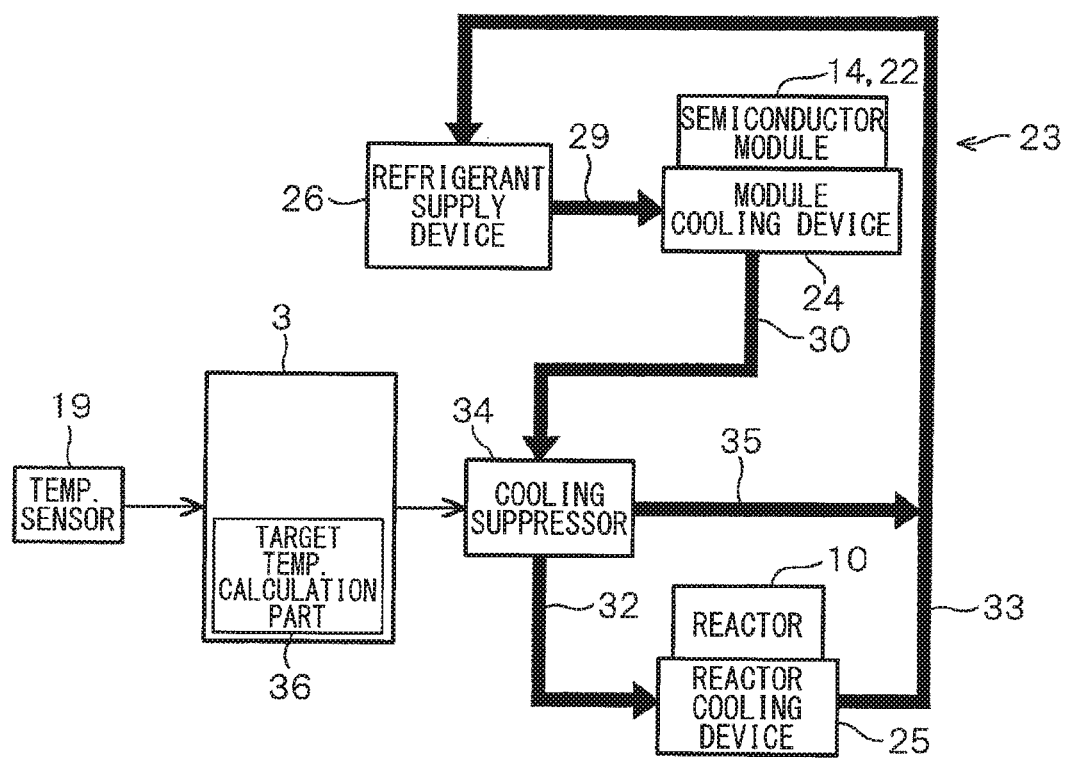
FIG. 1 is a view schematically showing a cooling structure in an inverter device according to a first embodiment.

Meanwhile, the inverter device 1: incorporates the booster converter 7 and the inverter circuits 8 and 8 into a case not shown in the figures; and also incorporates a cooling mechanism 23 (refer to FIGS. 1 and 2) for cooling components constituting the booster converter 7 and the inverter circuits 8 and 8 and is unitized. As shown in FIGS. 1 and 2, according to the present embodiment, the cooling mechanism 23 includes a module cooling device 24 to cool the semiconductor modules 14 and 22. Further, the cooling mechanism 23 includes: a reactor cooling device 25 that is a cooling device to cool the reactor 10; and a refrigerant supply device 26 to supply a refrigerant (for example, an antifreezing solution) as a cooling fluid of a low temperature to the module cooling device 24 and the reactor cooling device 25.

Among them, the module cooling device 24 is configured of a known multilayered cooler. That is, as shown in FIG. 2, the module cooling device 24 has a plurality (eight units in the figure) of cooling plates 27 arranged in parallel side by side in the right and left directions in the figure. Although details are not shown in the figure: each cooling plate 27 comprises a metal such as aluminum and is configured so as to be thin (flat) and hollow in the right and left directions in the figure; an inlet of a refrigerant is arranged on the rear end side in the figure; and an outlet of the refrigerant is arranged on the front end side in the figure. An inlet of each cooling plate 27 is connected to an inlet side header part that is located on the back side and long in the right and left directions in the figure. Further, an outlet of each cooling plate 27 is connected to an outlet side header part 28 that is located on this side and long in the right and left directions in the figure.

As it will be described later, a refrigerant of a low temperature supplied from the refrigerant supply device 26 passes through a first supply pipe 29 constituting a cooling channel and is supplied to the inlet side header part. Then the refrigerant flows from the back side toward this side in the figure in the respective cooling plates 27 and is discharged from the outlet side header part 28 to an intermediate discharge pipe 30 constituting a cooling channel. The semiconductor module 14 and the six semiconductor modules 22 are arranged respectively in sequence from the left in the figure in seven spaces which are formed by the cooling plates 27. In this way, the semiconductor module 14 and the semiconductor modules 22 are cooled by the module cooling device 24.

In contrast, the reactor cooling device 25 has a cooling plate 31 that is a cooling member arranged at the bottom of the reactor 10 in a thermally contact state. The cooling plate 31: comprises a metal such as aluminum; is configured so as to be thin and hollow; and has a refrigerant inlet and a refrigerant outlet for supplying and discharging a refrigerant to and from the interior. The refrigerant inlet on the back side in the figure is connected to a second supply pipe 32 constituting a cooling channel and a refrigerant is supplied from the second supply pipe 32 into the cooling plate 31.

Then a second discharge pipe 33 constituting a cooling channel is connected to the refrigerant outlet on this side in the figure and the refrigerant is discharged from the interior of the cooling plate 31.

The refrigerant supply device 26, although the details are not shown in the figure, has a pump for circulating and supplying a refrigerant through cooling channels and a heat exchanger (radiator) for cooling a refrigerant of a high temperature. According to the present embodiment, the cooling channels are arranged in the state of connecting the cooling channel of the module cooling device 24 and the cooling channel of the reactor cooling device 25. That is, as shown also in FIG. 1, a refrigerant discharged from the refrigerant supply device 26 passes through the first supply pipe 29 and is supplied to the module cooling device 24. The refrigerant discharged from the module cooling device 24 passes through the intermediate discharge pipe 30 and is supplied to a cooling suppressor 34.

On this occasion, for example the cooling suppressor 34 includes a switching valve having one inlet and two first and second outlets and is configured switchably so that a fluid (refrigerant) entering from the inlet may flow toward either of the first and second outlets selectively. For example, the first outlet is connected to an intermediate return pipe 35 and the second outlet is connected to the second supply pipe 32. As a result, in the state of switching the cooling suppressor 34 to the first outlet side (this is referred to as a "first state"), as shown by the arrows A and B in FIG. 2, the cooling structure is configured so as to return the refrigerant discharged from the intermediate discharge pipe 30 after supplied to the module cooling device 24 directly to the refrigerant supply device 26. That is, the refrigerant is supplied only to the module cooling device 24 and the semiconductor modules 14 and 22 are cooled.

In contrast, in the state of switching the cooling suppressor 34 to the second outlet side (this is referred to as a "second state"), as shown by the arrows A and C in FIG. 2, the refrigerant discharged from the intermediate discharge pipe 30 after supplied to the module cooling device 24 passes through the second supply pipe 32 and is supplied to the reactor cooling device 25. Successively, the cooling structure is configured so as to return the refrigerant from the second discharge pipe 33 to the refrigerant supply device 26. That is, the refrigerant is supplied to both the module cooling device 24 and the reactor cooling device 25 and cools both the semiconductor modules 14 and 22 and the reactor 10.

On this occasion, the switching of the cooling suppressor 34 is controlled by the control device 3, A signal detected by the temperature sensor 19 to detect a temperature of the reactor 10 is inputted into the control device 3. Then the control device 3 has a target temperature calculation part 36 to determine a target temperature of the reactor 10 mainly by a software-like configuration.

As details will be described in the next explanation on operation, a target temperature is determined as follows. That is, a target temperature is determined to a temperature in a vicinity of a temperature at which a loss is lowest, in other words, to a temperature slightly lower than a temperature of the lowest loss, from a heat resistant temperature of the reactor 10 and temperature characteristics showing a relationship between a temperature and a power loss of the reactor 10 (the magnetic core 15 or the whole reactor 10). Here, the heat resistant temperature of the reactor 10 is determined from Curie points of the film of the coil 16 and the magnetic core 15, a heat resistant temperature of a binder material such as a resin forming the magnetic core 15, and others. Here, if a component having a low heat resistant temperature exists at the periphery of the reactor 10, a heat resistant temperature corresponding to the heat resistant temperature of the peripheral component is set.

Then the control device 3 keeps the cooling suppressor 34 in the second state in normal times. On this occasion, when a detected temperature of the reactor 10 detected by the temperature sensor 19 is equal to or lower than a predetermined temperature (for example, 10° C.) lower than a target temperature, the temperature is raised to the target temperature early. For that reason, the flow of a refrigerant toward the reactor cooling device 25 is blocked by switching the cooling suppressor 34 to the first state, in other words, the cooling of the reactor 10 is suppressed. In this way, the temperature regulating device for the reactor 10 according to the present embodiment includes the reactor cooling device 25, the cooling suppressor 34, the control device 3, and others.

Figure 6A:
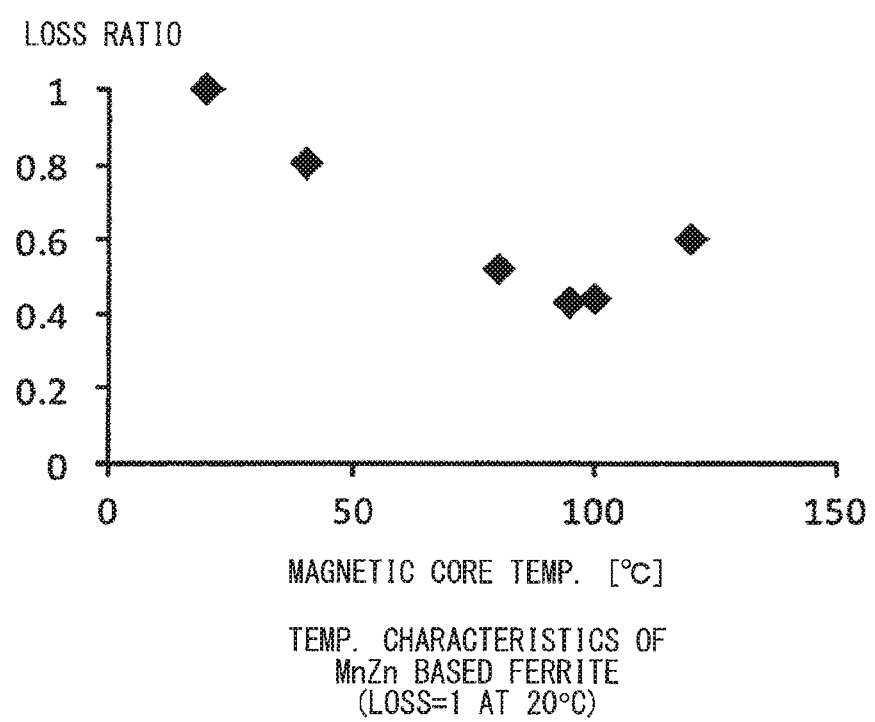
FIG. 6A is a characteristic graph showing temperature characteristics of a magnetic core comprising an MnZn based ferrite.
Figure 6B:
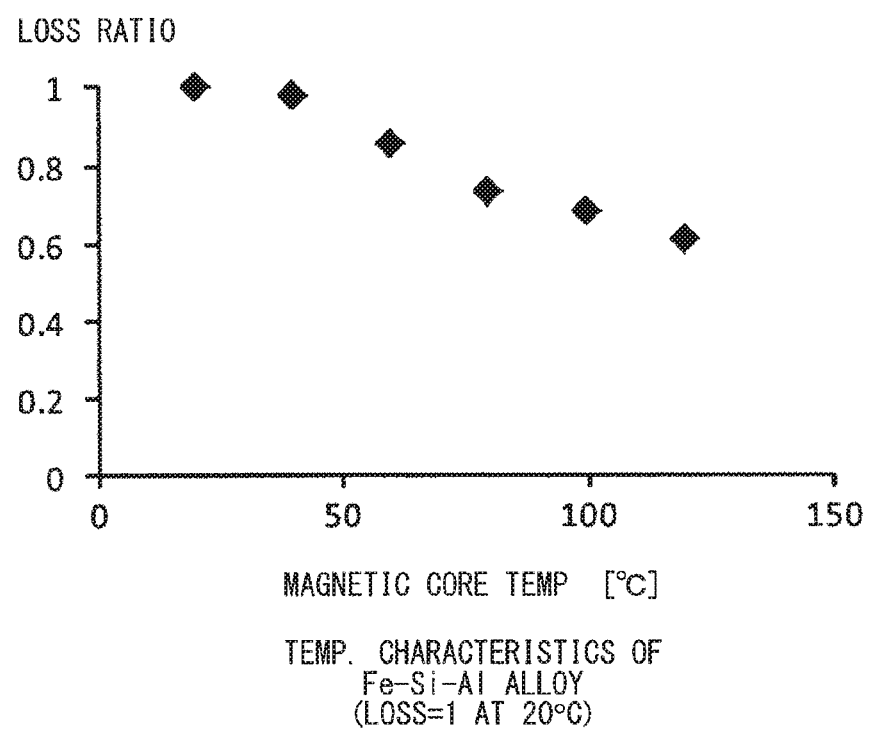
FIG. 6B is a characteristic graph showing temperature characteristics of a magnetic core comprising an Fe—Si—Al alloy.

The operation of the above configuration is described hereunder in reference also to FIGS. 3, 6A, 6B, 7A, and 7B. Firstly here, a relationship between a power loss and a temperature of a reactor 10 is described. As shown in FIGS. 6A and 6B, in a magnetic circuit component such as a reactor 10 or the like, a loss in temperature characteristics showing a relationship between a temperature and a loss increases comparatively at a low temperature, for example at about 20° C., although the temperature characteristics vary in accordance with the material of a magnetic core 15. Then it is known that a loss tends to reduce as the temperature rises in the range up to 100° C. for example (for example, refer to JP 2007-51052 A and WO 2011/016207 A1).

FIG. 6A shows temperature characteristics, namely loss ratios when a loss at 20° C. is regarded as 1, in the case where the material of a magnetic core 15 is an MnZn based ferrite. As the temperature rises from 20° C., the power loss reduces and a temperature of the lowest loss exists in a vicinity of 100° C. On this occasion, assuming that the heat resistant temperature of a reactor 10 is set at 150° C., the target temperature is determined to 80° C. slightly lower than 100° C. that is a temperature of the lowest loss.

Further, FIG. 6B shows temperature characteristics, namely loss ratios when a loss at 20° C. is regarded as 1, in the case where the material of a magnetic core 15 is an Fe—Si—Al alloy. In the case of this material, a temperature of the lowest loss exists in a vicinity of 120° C. Also on this occasion, assuming that the heat resistant temperature of a reactor 10 is set at 150° C., the target temperature is determined to 100° C. slightly lower than 120° C. that is a temperature of the lowest loss.

Figure 7A:
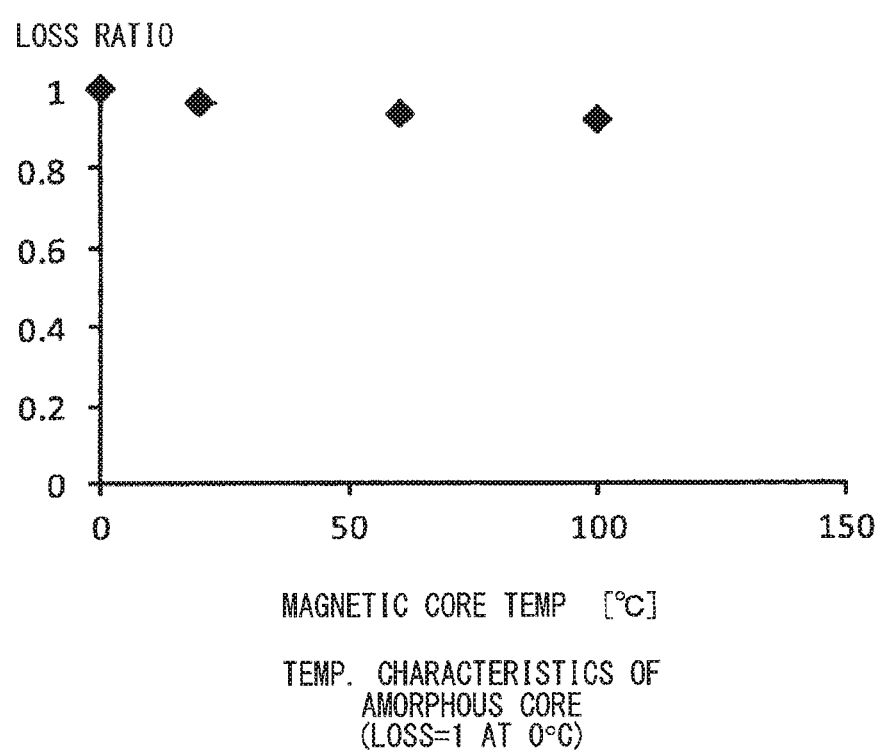
FIG. 7A is a characteristic graph showing temperature characteristics of an amorphous magnetic core alone.
Figure 7B:
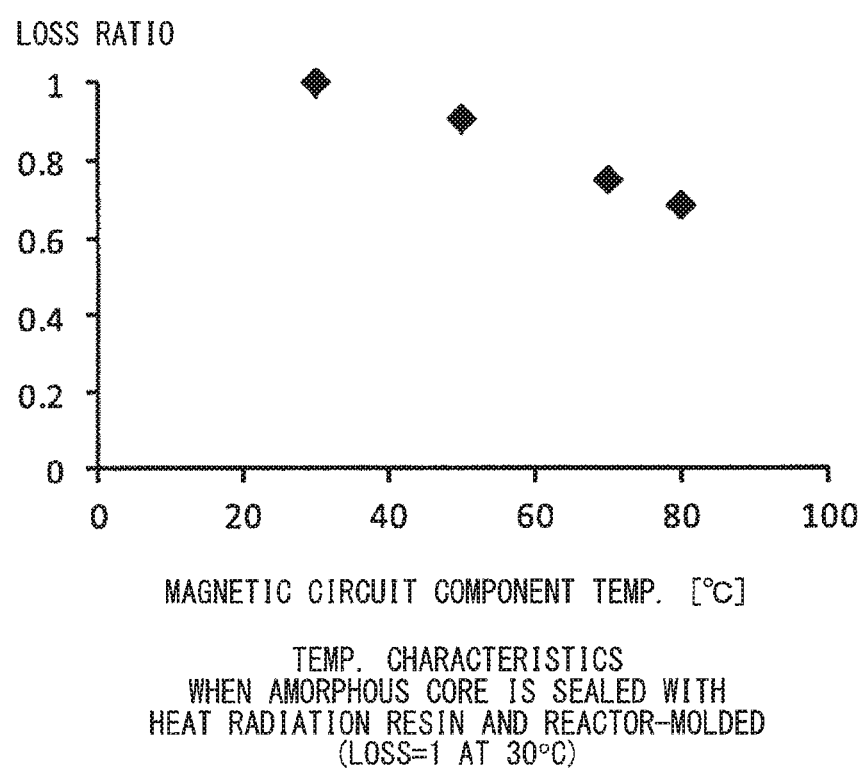
FIG. 7B is a characteristic graph showing temperature characteristics of a reactor using an amorphous magnetic core alone.

In contrast, FIGS. 7A and 7B show the cases where the materials of magnetic cores 15 are amorphous. FIG. 7A shows a relationship between a power loss and a temperature in a magnetic core 15 alone, namely loss ratios that are the temperature characteristics when a loss at 0° C. is regarded as 1. In the case of this amorphous magnetic core 15, the losses do not so much change in response to the temperatures and temperature dependence is scarcely seen in the case of the magnetic core 15 alone.

According to studies by the present inventors however, the following phenomenon is seen: in the case of an amorphous core, reducing a loss in response to temperature rise when the amorphous core is incorporated into an inverter device 1 (unit) as a reactor 10 even though temperature dependence of a power loss is not seen in the case of a magnetic core 15 alone. FIG. 7B shows temperature characteristics (loss ratios when a loss at 30° C. is regarded as 1) in the case of incorporating a reactor 10 formed by sealing an amorphous magnetic core 15 with an insulating layer of an epoxy resin or the like for example into a case. As the temperature rises from 30° C., the power loss reduces and a temperature of the lowest loss exists in a vicinity of 80° C.

A reason for causing such a phenomenon is estimated to be that: during the time when an insulating resin for sealing a magnetic core 15 hardens and contracts or when a reactor 10 is fixed, a stress is applied to the magnetic core 15 and, at a low temperature where a Young's modulus is high, a strain is caused in the magnetic core 15 by a remaining stress and a loss increases; but, as the temperature rises, the Young's modulus reduces, the stress applied to the magnetic core 15 is mitigated, and thus the loss reduces. Also on such an occasion, in consideration of a heat resistant temperature, a target temperature is determined for example to 60° C. slightly lower than 80° C. that is a temperature of the lowest loss.

Meanwhile, when an inverter device 1 is actuated, a control device 3 controls a switching valve of a cooling suppressor 34 to the second state (second outlet side) in normal times. On this occasion, as shown by the arrow A and the arrow C in FIG. 2, a refrigerant is supplied to both a module cooling device 24 and a reactor cooling device 25. As a result, semiconductor modules 14 and 22 and a reactor 10, those being heat-generating components, are attempted to be cooled by a cooling mechanism 23.

In contrast, when a detected temperature of the reactor 10 detected by a temperature sensor 19 is equal to or lower than a predetermined temperature (for example, 10° C.) lower than a target temperature, the control device 3 actuates the cooling suppressor 34 so as to raise the temperature to the target temperature early. An on-off valve is thereby switched to the first state (first outlet side) and the flow of a refrigerant is switched to the directions shown by the arrow A and the arrow B in FIG. 2, in other words, to a circulation mode of not passing through the reactor cooling device 25. Consequently, the refrigerant is not supplied to the reactor cooling device 25 and the cooling of the reactor 10 is suppressed, in other words, the temperature rise of the reactor 10 is accelerated.

The flowchart in FIG. 3 shows control procedures that are executed by a control device 3 and related to temperature regulation for a reactor 10, namely switching of a valve in a cooling suppressor 34. That is, at step S1, a heat resistant temperature of the reactor 10, 150° C. for example, is set. At succeeding step S2, a target temperature is calculated. As described earlier, the target temperature is a temperature lower than the heat resistant temperature of the reactor 10 and is determined to a temperature slightly lower than a temperature of the lowest loss from the temperature characteristics of a magnetic core 15 alone or the whole reactor 10.

To give concrete examples, as shown in FIG. 6A, when the material of a magnetic core 15 is an MnZn based ferrite, the target temperature can be set at 80° C. As shown in FIG. 6B, when the material of a magnetic core 15 is an Fe—Si—Al alloy, the target temperature can be set at 100° C. Further, as shown in FIG. 7B, when the material of a magnetic core 15 is amorphous, the target temperature can be set at 60° C. It is possible to: measure such temperature characteristics as shown in FIGS. 6A and 6B and FIGS. 7A and 7B experimentally beforehand; and calculate and determine a target temperature in consideration of the heat resistant temperature of a reactor 10 or peripheral components.

Returning to FIG. 3, at step S3, whether or not the temperature of the reactor 10 detected by a temperature sensor 19 is a predetermined temperature or lower is judged.

The predetermined temperature is a predetermined temperature lower than a target temperature and, on this occasion, is set at 10° C. for example in consideration of start-up of a vehicle during winter season and the like. When the temperature of the reactor 10 exceeds the predetermined temperature (No at step S3), a cooling suppressor 34 is not actuated and keeps the second state. As described above thereby, a refrigerant is supplied to both a module cooling device 24 and a reactor cooling device 25 and semiconductor modules 14 and 22 and the reactor 10 are attempted to be cooled.

In contrast, when the temperature of the reactor 10 is the predetermined temperature or lower (Yes at step S3), at step S4, the cooling suppressor 34 is actuated and switched to the first state. As a result, a refrigerant is supplied only to the side of the module cooling device 24 and is not supplied to the reactor cooling device 25. Consequently, whereas the semiconductor modules 14 and 22 are kept cooling, the temperature of the reactor 10 is attempted to be raised. At succeeding step S5, whether or not the temperature of the reactor 10 detected by the temperature sensor 19 has reached the target temperature is determined.

When the temperature of the reactor 10 does not reach the target temperature yet or abnormal operation is not detected (No at step S5), the process returns to step S4 and the operation of the cooling suppressor 34 (the first state) continues. Then, when the temperature of the reactor 10 reaches the target temperature or abnormal operation is detected (Yes at step S5), the cooling suppressor 34 returns to the usual second state and the process finishes.

In this way, according to the present embodiment, a temperature regulating device is configured so as to determine a target temperature that allows the power loss of a reactor 10 to reduce and suppress the cooling of the reactor 10 by a cooling suppressor 34 when the temperature of the reactor 10 is equal to or lower than a predetermined temperature lower than the target temperature. As a result, it is possible to: raise the temperature of the reactor 10 to the target temperature rapidly; prevent the temperature of the reactor 10 from hardly rising and a loss from increasing at the time of start-up during winter season or the like for example; and suppress the power loss of the reactor 10 to a comparatively low level.

Further, according to the present embodiment, a target temperature is set at a temperature slightly lower than a temperature at which a loss is lowest. If a target temperature is set at a temperature of the lowest loss here, there is the possibility that an actual temperature of a reactor 10 exceeds the target temperature, a loss increases rapidly, and thermal runaway is caused undesirably. By setting a target temperature at a temperature slightly lower than a temperature of the lowest loss like the present embodiment however, such failure can be prevented. Needless to say, when failure does not exist in a vicinity of a temperature of the lowest loss even in consideration of variation as a result of preliminary measurement, a target temperature may be set at a temperature in a vicinity of a temperature of the lowest loss.

According to the present embodiment in particular, a target temperature is set by not only using a relationship between a temperature and a loss in a magnetic core 15 alone constituting a reactor 10 but also using a relationship between a temperature and a loss in a whole reactor 10 in the case where the material of the magnetic core 15 is amorphous. As a result, even when a power loss does not depend on a temperature with the magnetic core 15 alone, when the magnetic core 15 is incorporated as the reactor 10 into a power converter, the power loss of the reactor 10 can be suppressed to a low level likewise by using the relationship of reducing a loss in response to temperature rise.

Further, according to the present embodiment, cooling channels to circulate and supply a refrigerant are connected in series as a concrete configuration of a reactor cooling device 25 and a module cooling device 24 (cooling mechanism 23). Then a temperature regulating device is configured so as to suppress the cooling of a reactor 10 by blocking the flow of a refrigerant toward the reactor cooling device 25 by a cooling suppressor 34 including a switching valve. As a result, parts of a refrigerant supply device 26 and the cooling channels can be shared between the reactor cooling device 25 and the module cooling device 24 and the cooling mechanism 23 can be configured by a comparatively simple configuration. Further, during the operation of the cooling suppressor 34 (the first state), it is possible to improve the efficiency in cooling semiconductor modules 14 and 22 by shortening the cooling channels, in other words, to attempt to reduce the driving power of a pump of the refrigerant supply device 26.

(2) Second Embodiment

Figure 8:
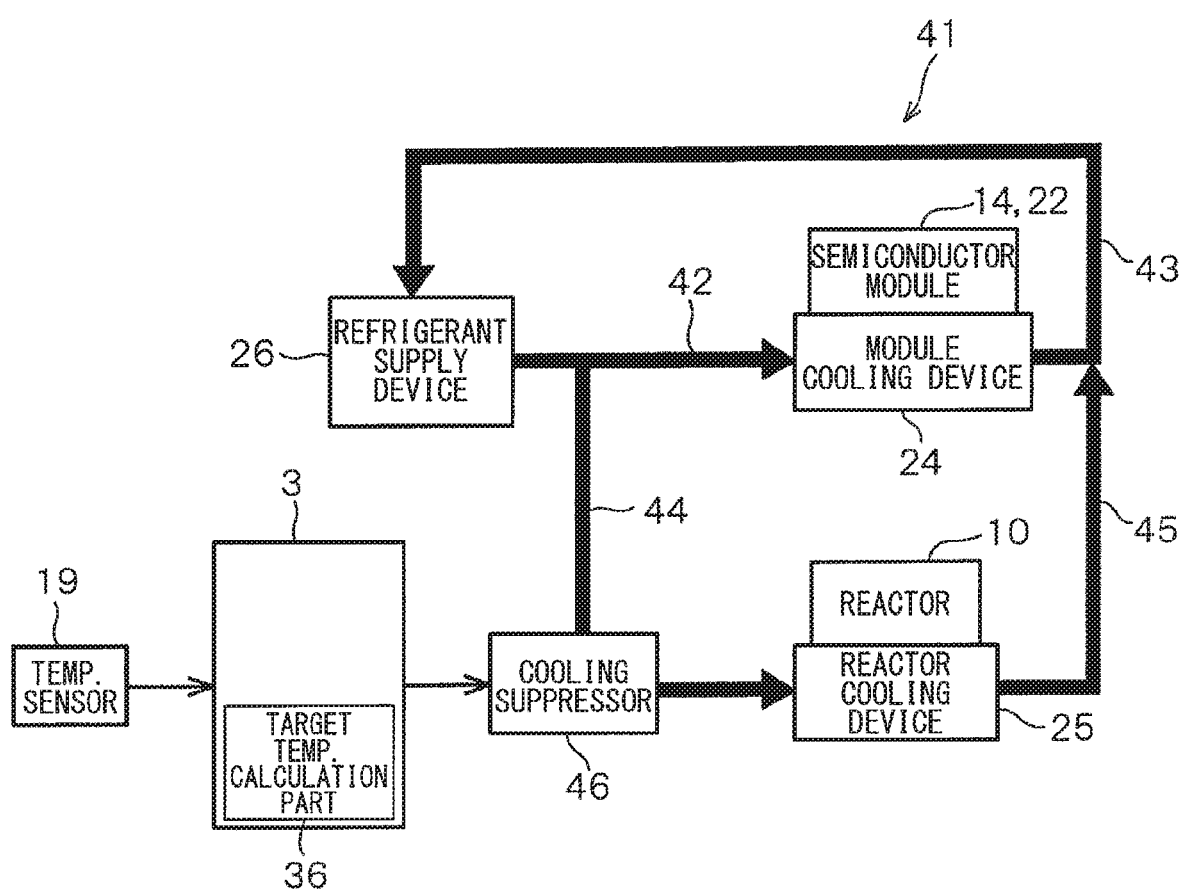
FIG. 8 is a view schematically showing a cooling structure in an inverter device according to a second embodiment.
Figure 9:
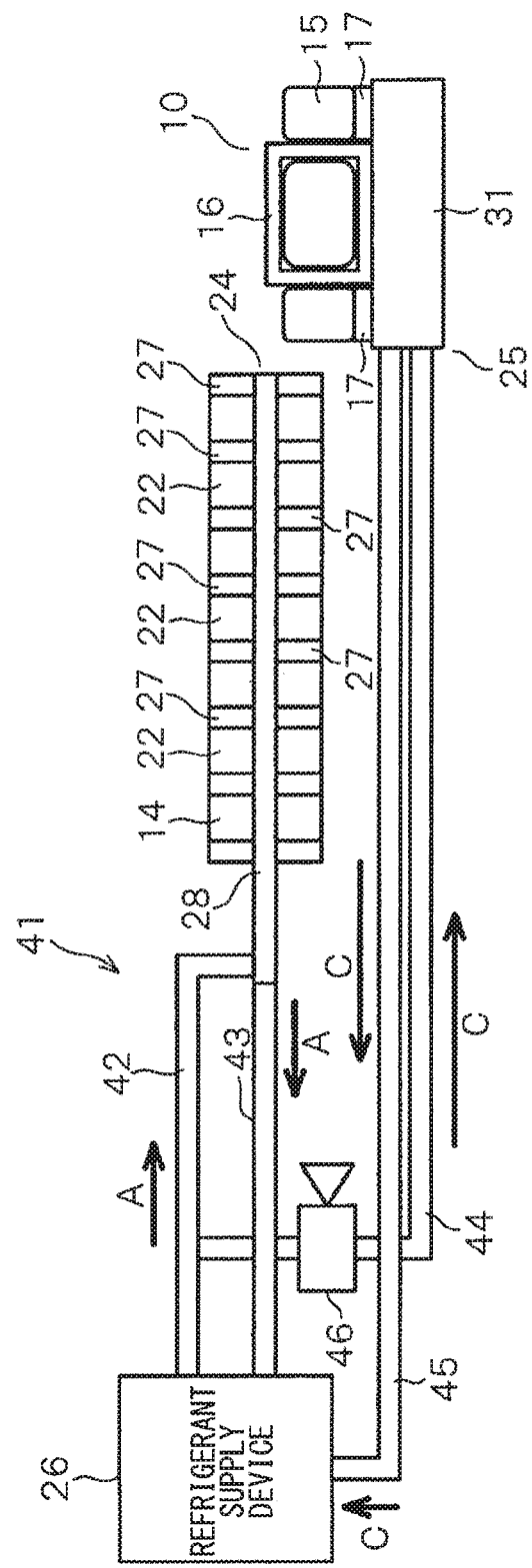
FIG. 9 is a view schematically showing a configuration of a cooling device.

FIGS. 8 and 9 show a second embodiment. A point of the second embodiment different from the first embodiment is the configuration of cooling channels in a cooling mechanism 41 for cooling semiconductor modules 14 and 22 and a reactor 10. In the first embodiment, a refrigerant flows from a refrigerant supply device 26 toward a module cooling device 24 and a reactor cooling device 25 so to say in series. In contrast, the cooling mechanism 41 according to the second embodiment is configured so that a refrigerant may flow toward a module cooling device 24 and a reactor cooling device 25 so to say in parallel.

In other words, as shown by the arrow A in FIG. 9, a refrigerant discharged from a refrigerant supply device 26 passes through a first supply pipe 42 and is supplied to a module cooling device 24 (inlet side header part) and the refrigerant discharged from an outlet side header part 28 passes through a first discharge pipe 43 and returns to the refrigerant supply device 26. A second supply pipe 44 is arranged in the manner of branching from the halfway of the first supply pipe 42 and, as shown by the arrow C in FIG. 9, the refrigerant passes through the second supply pipe 44 and is supplied to a reactor cooling device 25. The refrigerant discharged from the reactor cooling device 25 passes through a second discharge pipe 45, merges with a middle region of the first discharge pipe 43, and returns to the refrigerant supply device 26. On this occasion, a cooling suppressor 46 is arranged at a middle part of the second supply pipe 44.

The cooling suppressor 46 includes an on-off valve to open and close the second supply pipe 44 and the opening and closing is controlled by a control device 3. In normal times, the cooling suppressor 46 is in an open state and the circulation of supplying a refrigerant to both the module cooling device 24 and the reactor cooling device 25 and returning the refrigerant to the refrigerant supply device 26 is carried out. Then the control device 3 has a target temperature calculation part 36 and controls the cooling suppressor 46 similarly to the first embodiment. As a result, the cooling suppressor 46 is operated so as to raise a temperature up to a target temperature early when a detected temperature of the reactor 10 detected by a temperature sensor 19 is a predetermined temperature lower than the target temperature, for example 10° C., or lower.

In this way, the on-off valve of the cooling suppressor 46 is switched to a closed state and the flow of the refrigerant in the second supply pipe 44 is blocked. In this state, the refrigerant is supplied only to the module cooling device 24, the semiconductor modules 14 and 22 are cooled, the refrigerant is not supplied to the reactor cooling device 25, and the cooling of the reactor 10 is suppressed, in other words, the temperature rise of the reactor 10 is accelerated. Consequently, according to the second embodiment also, the operation and effect of being able to suppress the power loss of a reactor 10 to a comparatively low level and the like can be obtained similarly to the first embodiment.

(3) Third and Fourth Embodiments

Figure 10:
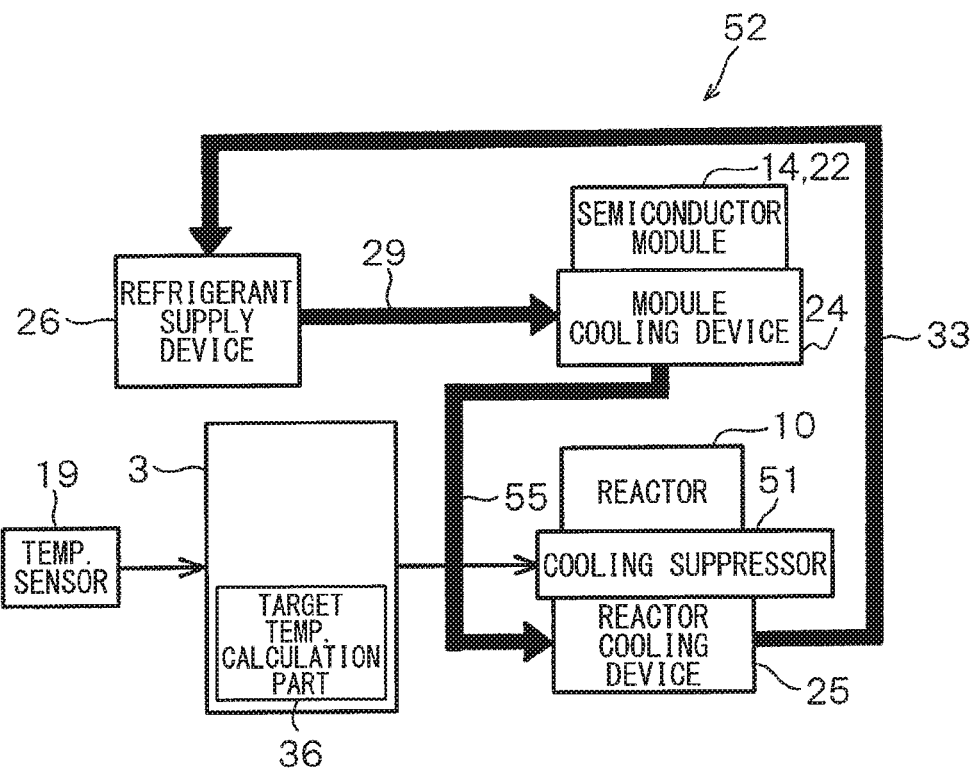
FIG. 10 is a view schematically showing a cooling structure in an inverter device according to a third embodiment.
Figure 11:
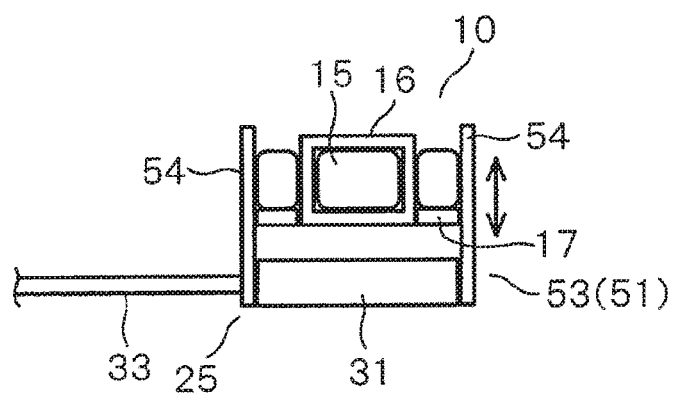
FIG. 11 is a view schematically showing a configuration of a cooling suppressor part.

FIGS. 10 and 11 show a third embodiment. In the third embodiment, the configuration of a cooling mechanism 52 including a cooling suppressor 51 is different from the first embodiment. That is, in the present embodiment, as shown in FIG. 11, the cooling suppressor 51 includes: a transfer mechanism 53 to transfer a reactor 10 in the directions of approaching to and separating from a cooling plate 31 of a reactor cooling device 25; and a driving source.

On this occasion, the reactor 10 is supported so as to be movable vertically in the figure to the cooling plate 31 with a slide rail 54. Then the reactor 10 moves between a lowered position of coming into contact with the cooling plate 31 and a raised position of physically separating from the cooling plate 31 by the transfer mechanism 53. The transfer mechanism 53: can be configured by using a motor, a solenoid, a hydraulic mechanism, or the like not shown in the figures as a driving source; and, as shown in FIG. 10, is controlled by a control device 3 having a target temperature calculation part 36.

As shown in FIG. 10, the cooling mechanism 52 has a configuration formed by removing an intermediate return pipe 35 and a cooling suppressor 34 from a cooling mechanism 23 (refer to FIG. 1) according to the first embodiment. That is, a refrigerant discharged from a refrigerant supply device 26 is supplied to a module cooling device 24 (inlet side header part) and the refrigerant discharged from an outlet side header part 28 passes through a second supply pipe 55 and is supplied to the cooling plate 31 of the reactor cooling device 25. The refrigerant discharged from the cooling plate 31 is circulated in the manner of passing through a second discharge pipe 33 and returning to the refrigerant supply device 26.

In normal times, the control device 3 locates the reactor 10 at a lowered position and semiconductor modules 14 and 22 and the reactor 10 are cooled by the module cooling device 24 and the reactor cooling device 25. Then the control device 3 actuates the cooling suppressor 51 and moves the reactor 10 to the raised position when the detected temperature of the reactor 10 detected by a temperature sensor 19 is equal to or lower than a predetermined temperature lower than a target temperature similarly to the first embodiment. As a result, the reactor 10 moves away from the cooling plate 31, the cooling is suppressed, and the temperature rises to the target temperature early. Consequently, according to the third embodiment also, the operation and effect of being able to suppress the power loss of a reactor 10 to a comparatively low level and the like can be obtained similarly to the first embodiment. Further, an intended purpose can be attained with a comparatively simple configuration.

Figure 12:
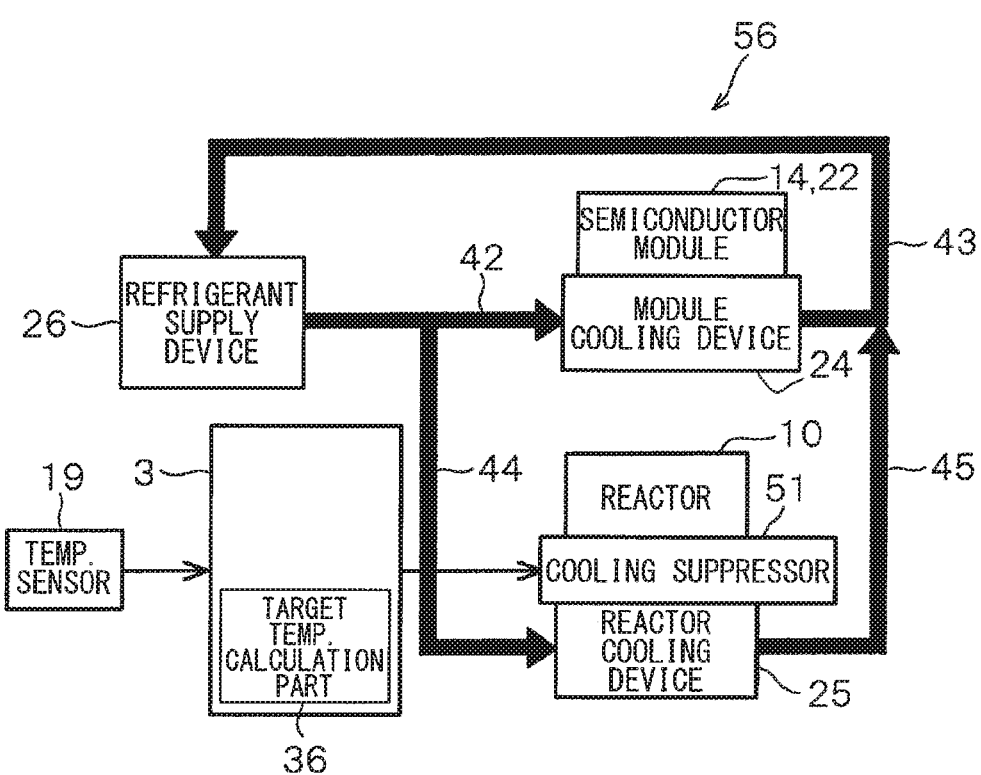
FIG. 12 is a view schematically showing a cooling structure in an inverter device according to a fourth embodiment.

FIG. 12 shows a fourth embodiment and a point different from the third embodiment is the configuration of a cooling mechanism 56. That is, the cooling mechanism 56 according to the fourth embodiment has a cooling suppressor 51 similar to the third embodiment in place of a cooling suppressor 46 (refer to FIG. 8) according to the second embodiment.

In the cooling mechanism 56, a refrigerant discharged from a refrigerant supply device 26 passes through a first supply pipe 42 and is supplied to a module cooling device 24 (inlet side header part) nearly similarly to the second embodiment. Then the refrigerant discharged from an outlet side header part 28 passes through a first discharge pipe 43 and returns to the refrigerant supply device 26. A second supply pipe 44 branching from the halfway of the first supply pipe 42 is arranged and the refrigerant passes through the second supply pipe 44 and is supplied to a cooling plate 31 of a reactor cooling device 25. The refrigerant discharged from the reactor cooling device 25 passes through a second discharge pipe 45, merges with a middle region of the first discharge pipe 43, and returns to the refrigerant supply device 26.

In normal times, a control device 3 locates a reactor 10 at a lowered position. Then the control device 3 actuates the cooling suppressor 51, moves the reactor 10 to the raised position, and suppresses the cooling when the detected temperature of the reactor 10 detected by a temperature sensor 19 is equal to or lower than a predetermined temperature lower than a target temperature. Consequently, according to the fourth embodiment also, the operation and effect of being able to suppress the power loss of a reactor 10 to a comparatively low level and the like can be obtained similarly to the first embodiment.

(4) Fifth and Sixth Embodiments

Figure 13:
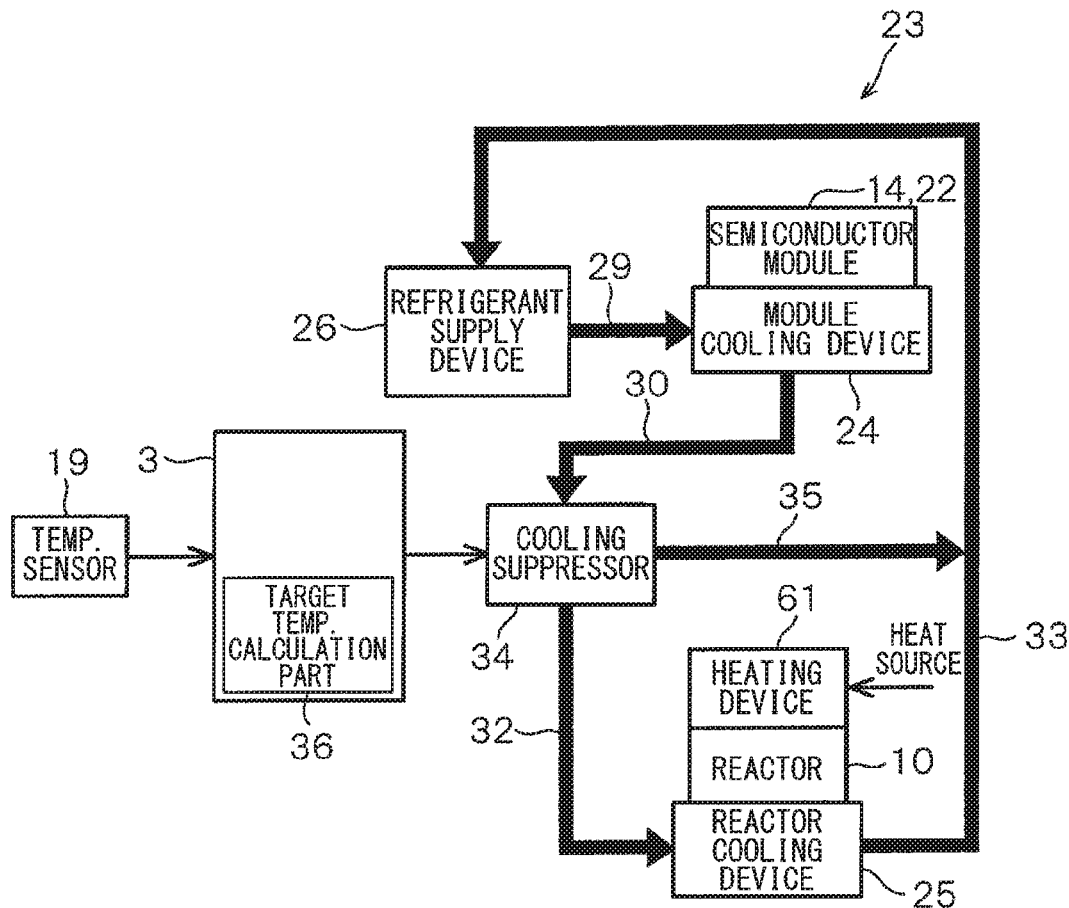
FIG. 13 is a view schematically showing a cooling structure in an inverter device according to a fifth embodiment.
Figure 14:
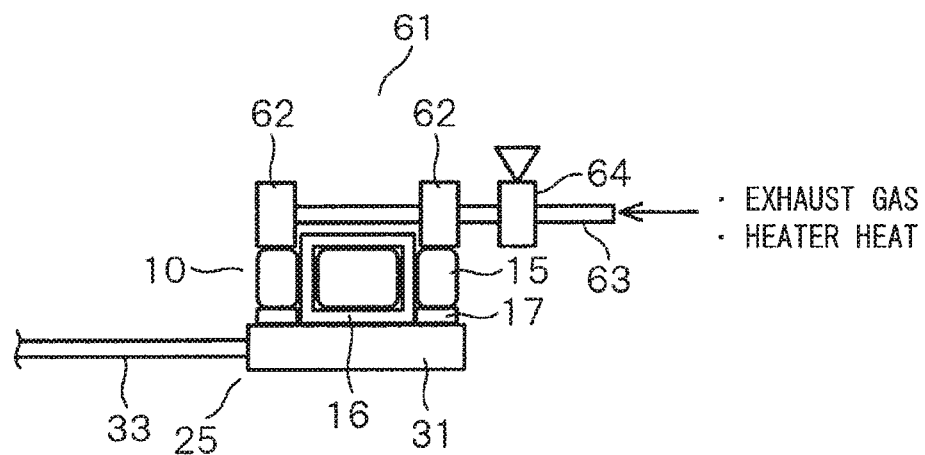
FIG. 14 is a view schematically showing a configuration of a heating device part.

FIGS. 13 and 14 show a fifth embodiment. A point of the fifth embodiment different from the first embodiment is that not only a cooling mechanism 23 but also a heating device 61 for heating a reactor 10 is arranged. As shown in FIG. 14, the heating device 61 for example comprises a heating plate 62 configured by forming aluminum, copper, or the like into a hollow shape, a heat supply pipe 63 for supplying a heating medium to the heating plate 62, and an on-off valve 64 arranged at a middle part of the heat supply pipe 63.

On this occasion, the heating plate 62 is thermally in contact with the top surface part in the figure of a magnetic core 15 in the reactor 10. A heated medium heated to a high temperature by using exhaust heat or combustion heat of a vehicle is supplied to the heat supply pipe 63. In normal times, the on-off valve 64 is in a closed state. By opening the on-off valve 64, a heated medium of a high temperature passes through the heat supply pipe 63 and is supplied to the heating plate 62 and the magnetic core 15 in the reactor 10 is heated.

As shown in FIG. 13, the opening and closing of the on-off valve 64 are controlled by a control device 3. The control device 3 controls a cooling suppressor 34 similarly to the first embodiment and also controls the on-off valve 64 as follows. That is, in normal times, the control device 3 controls the cooling suppressor 34 to a second state and also the on-off valve 64 to a closed state. Then the control device 3 switches the cooling suppressor 34 to a first state, stops supplying a refrigerant, and also controls the on-off valve 64 to an open state when the detected temperature of the reactor 10 detected by a temperature sensor 19 is equal to or lower than a predetermined temperature lower than a target temperature.

As a result, the cooling of the reactor 10 is suppressed (stopped), the magnetic core 15 in the reactor 10 is heated forcibly, and the temperature rises to the target temperature more rapidly. The cooling suppressor 34 returns to the second state and the on-off valve 64 comes to be in the closed state when the detected temperature of the reactor 10 detected by the temperature sensor 19 reaches the target temperature. Consequently, according to the fifth embodiment, in addition to the operation and effect according to the first embodiment, the temperature rise up to a target temperature of a reactor 10 can be accelerated more and the reduction of a power loss comes to be more effective. Further, because exhaust heat or combustion heat of a vehicle is used as the heat source of a heating device 61, the effective utilization of exhaust heat can be attempted.

Figure 15:
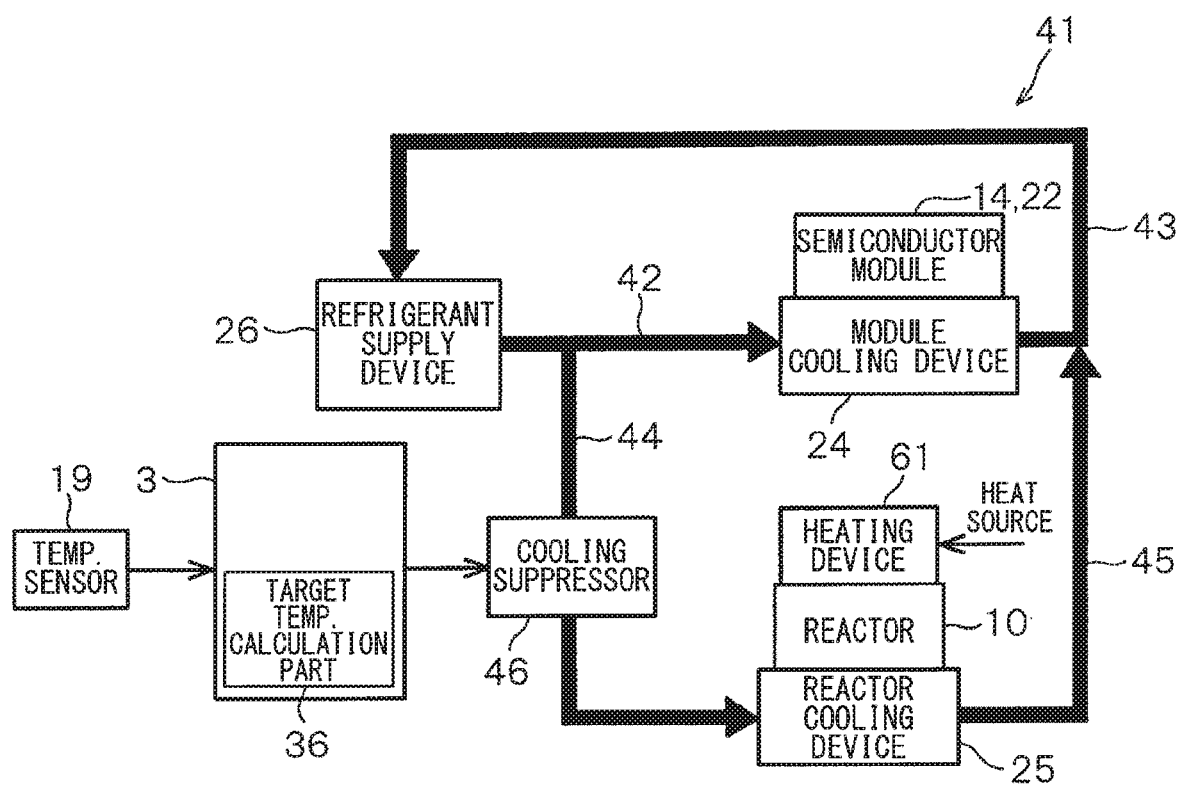
FIG. 15 is a view schematically showing a cooling structure in an inverter device according to a sixth embodiment.

FIG. 15 shows a sixth embodiment. According to the sixth embodiment, a cooling mechanism 41 similar to the second embodiment and also a heating device 61 to heat a reactor 10 similar to the fifth embodiment are arranged. On this occasion, a control device 3 controls a cooling suppressor 46 to a closed state so as to raise a temperature up to a target temperature early when the detected temperature of the reactor 10 detected by a temperature sensor 19 is equal to or lower than a predetermined temperature lower than the target temperature. With this, the control device 3 controls an on-off valve 64 of the heating device 61 to an open state.

Consequently, according to the sixth embodiment also, excellent effects of being able to more accelerate the temperature rise of a reactor 10 to a target temperature, reducing power loss more effectively, and the like can be obtained similarly to the fifth embodiment.

(5) Seventh, Eighth, and Other Embodiments

Figure 16:
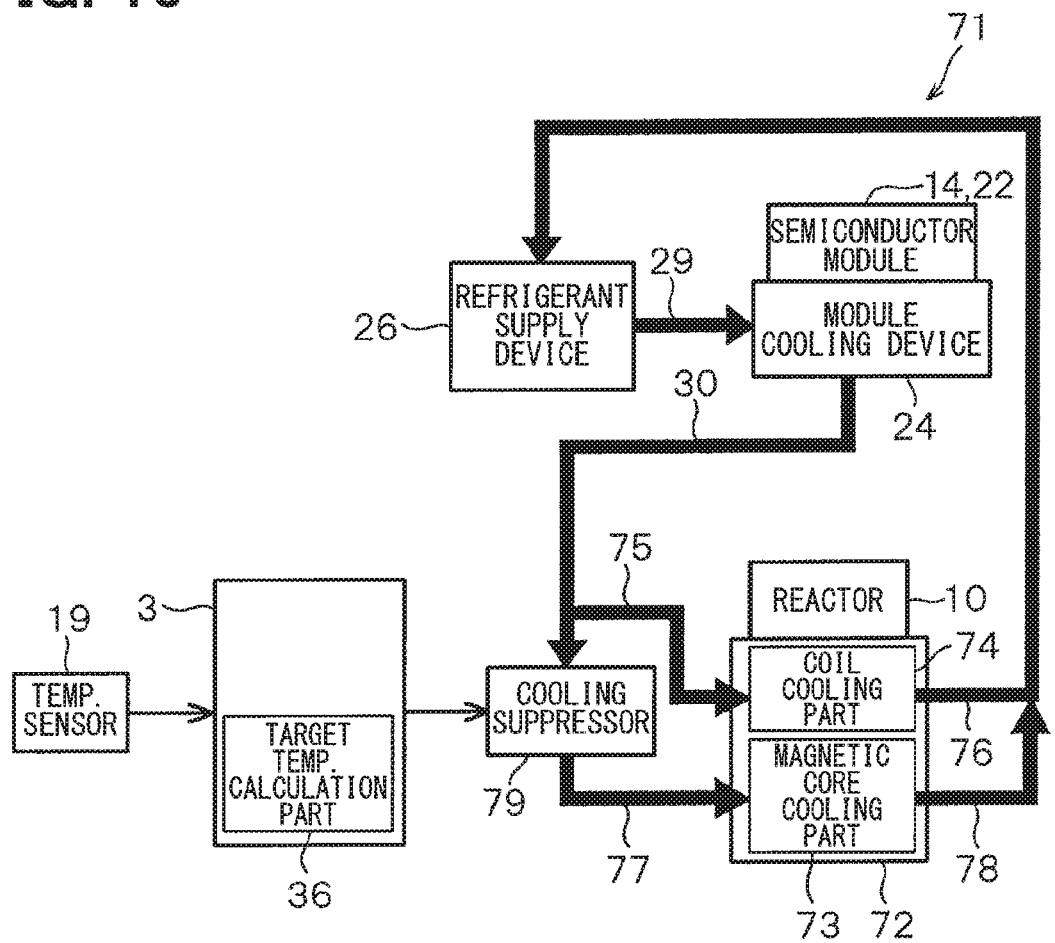
FIG. 16 is a view schematically showing a cooling structure in an inverter device according to a seventh embodiment.
Figure 17:
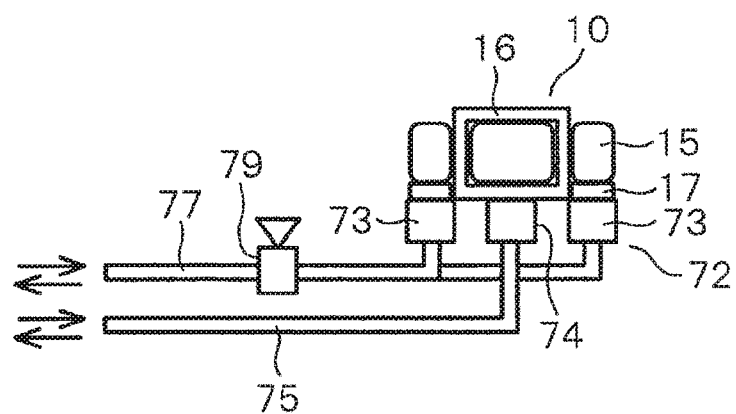
FIG. 17 is a view schematically showing a structure of a cooling device for a rector.

FIGS. 16 and 17 show a seventh embodiment. Points of the seventh embodiment different from the first embodiment are cooling channels of a cooling mechanism 71, the configuration of a reactor cooling device 72, and others. The reactor cooling device 72 has a core cooling part 73 for cooling a magnetic core 15 in a reactor 10 and a coil cooling part 74 for cooling a coil 16.

As shown in FIG. 17, the core cooling part 73 has a cooling plate as a cooling member configured by forming a metal such as aluminum into a hollow shape in the state of being thermally in contact with the bottom of the magnetic core 15. Further, the coil cooling part 74 has a cooling plate as a cooling member configured by forming a metal such as aluminum into a hollow shape in the state of being thermally in contact with the bottom of the coil 16. Then, as shown also in FIG. 16, a refrigerant is supplied to the coil cooling part 74 (cooling plate) through a coil side supply pipe 75, passes through a coil side discharge pipe 76, and is discharged.

In contrast, a refrigerant is supplied to the core cooling part 73 through a core side supply pipe 77 in the state of being parallel with a cooling channel of the coil cooling part 74, passes through a core side discharge pipe 78, and is discharged. A cooling suppressor 79 including an on-off valve is arranged at a middle part of the core side supply pipe 77. The refrigerant discharged from a refrigerant supply device 26 passes through a first supply pipe 29, is supplied to a module cooling device 24, and is used for cooling semiconductor modules 14 and 22. The refrigerant discharged from the module cooling device 24 is discharged through an intermediate discharge pipe 30.

The coil side supply pipe 75 and the core side supply pipe 77 are connected in the manner of branching from the intermediate discharge pipe 30. Further, a tip part of the coil side discharge pipe 76 is connected to the refrigerant supply device 26 and a tip part of the core side discharge pipe 78 is connected to a middle part of the coil side discharge pipe 76. As a result, in the state of opening the on-off valve of the cooling suppressor 79, the refrigerant having passed through the intermediate discharge pipe 30 passes through the coil side supply pipe 75 and is supplied to the coil cooling part 74. At the same time, the refrigerant passes through the core side supply pipe 77, is supplied to the core cooling part 73, and cools both the coil 16 and the magnetic core 15 in the reactor 10. The refrigerant having contributed to the cooling passes through the coil side discharge pipe 76 and the core side discharge pipe 78 and returns to the refrigerant supply device 26.

In contrast, in the state of closing the on-off valve of the cooling suppressor 79, the refrigerant having passed through the intermediate discharge pipe 30 passes through the coil side supply pipe 75, is supplied to the coil cooling part 74, and cools the coil 16. On the other hand, the flow of the refrigerant in the core side supply pipe 77 is blocked, the refrigerant is not supplied to the core cooling part 73, and the cooling of the magnetic core 15 is suppressed. On this occasion, the refrigerant passes through the coil side discharge pipe 76 and returns to the refrigerant supply device 26.

The opening and closing of the cooling suppressor 79 are controlled by a control device 3. That is, in normal times, the control device 3 controls the cooling suppressor 79 to an open state and the semiconductor modules 14 and 22 and the reactor 10 are cooled by the module cooling device 24 and the reactor cooling device 72. On this occasion, by supplying the refrigerant to both the core cooling part 73 and the coil cooling part 74, both the magnetic core 15 and the coil 16 in the reactor 10 are cooled.

Then the control device 3 actuates the cooling suppressor 79 and controls the on-off valve to a closed state when the detected temperature of the reactor 10 detected by a temperature sensor 19 is equal to or lower than a predetermined temperature lower than a target temperature. As a result, in the reactor cooling device 72, the refrigerant is supplied to the coil cooling part 74 and is stopped from being supplied to the core cooling part 73. Here, in the reactor 10, although a power loss increases at a low temperature in the magnetic core 15, a resistance value increases and a loss increases at a high temperature in the coil 16 and hence the coil 16 is cooled desirably.

According to the present embodiment, even when the temperature of a reactor 10 is a predetermined temperature or lower, the cooling of a magnetic core 15 only in the reactor 10 is suppressed and a coil 16 is cooled. As a result, the temperature of the magnetic core 15 rises up to a target temperature early while the temperature rise of the coil 16 is suppressed. Consequently, according to the seventh embodiment, it is possible to reduce a loss and enhance efficiency by arranging a core cooling part 73 and a coil cooling part 74 and controlling them individually.

Figure 18:
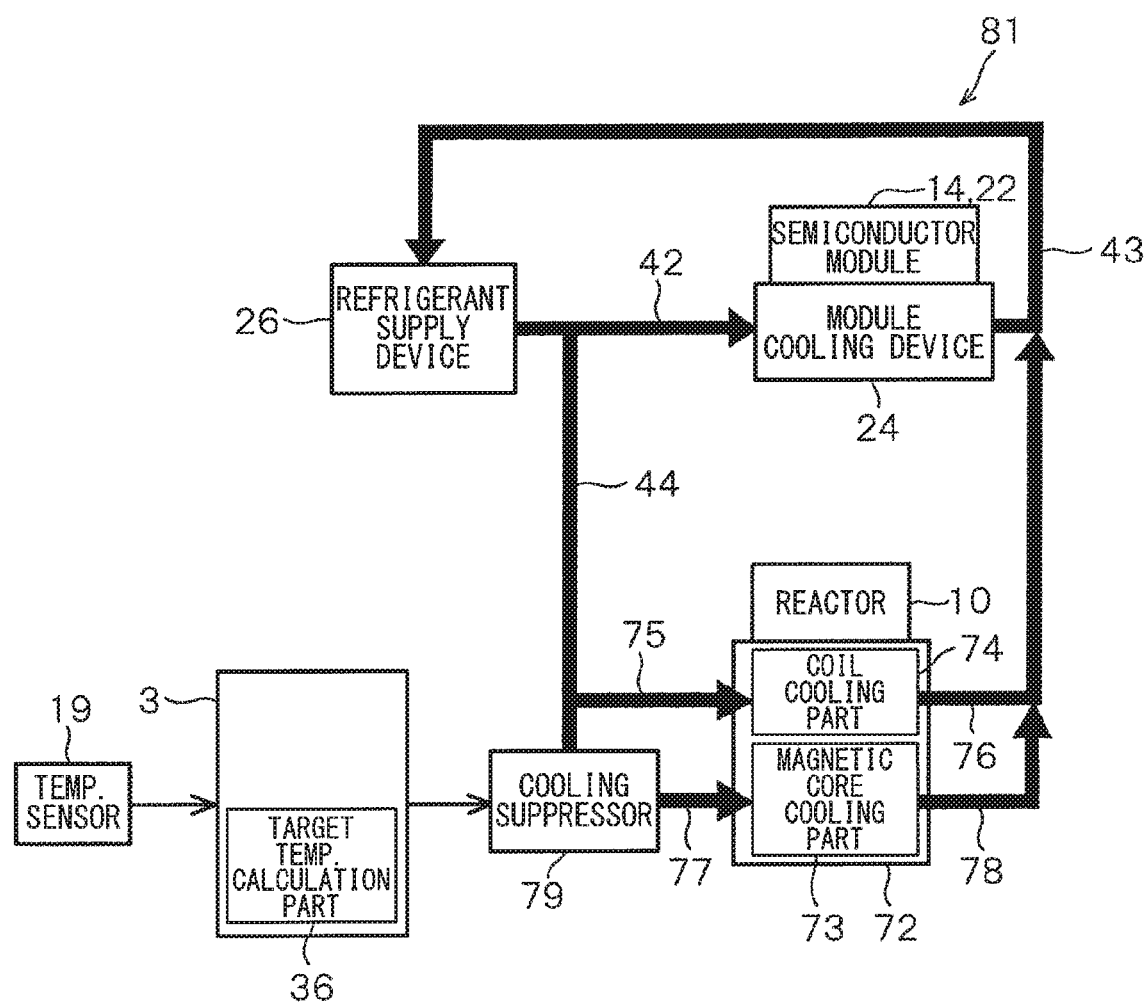
FIG. 18 is a view schematically showing a cooling structure in an inverter device according to an eighth embodiment.

FIG. 18 shows an eighth embodiment and a point different from the seventh embodiment is the configuration of refrigerant flow channels in a cooling mechanism 81. According to the eighth embodiment, a reactor cooling device 72 having a core cooling part 73 and a coil cooling part 74 is arranged and the flow of a refrigerant in those parts is controlled by a cooling suppressor 79 similarly to the seventh embodiment.

On this occasion, the refrigerant discharged from a refrigerant supply device 26 passes through a first supply pipe 42, is supplied to a module cooling device 24, passes through a first discharge pipe 43, and returns to the refrigerant supply device 26. A second supply pipe 44 is arranged in the manner of branching from the halfway of the first supply pipe 42 and a coil side supply pipe 75 and a core side supply pipe 77 are connected in the manner of branching into the two pipes from the second supply pipe 44. The cooling suppressor 79 is arranged at a middle part of the core side supply pipe 77. Further, a tip part of a core side discharge pipe 78 is connected to a middle part of a coil side discharge pipe 76 and a tip part of the coil side discharge pipe 76 is connected to a middle part of the first discharge pipe 43. Operation and effect similar to the seventh embodiment can be obtained also by such a configuration.

Meanwhile, although a figure is omitted, the following expansions and modifications can be adopted. That is, although a cooling mechanism is configured so as to suppress the cooling of a reactor by blocking the flow of a refrigerant into a reactor cooling device in each of the above embodiment, it is also possible to configure a cooling suppressor so as to reduce a refrigerant flow rate by a flow regulating valve or the like for example. As a cooling method, not only the flow of a refrigerant but also an air-cooled type to supply cooling air by a fan or the like may be adopted and, on this occasion, the cooling mechanism can be configured so as to suppress the cooling by blocking the cooling air or reducing the flow rate of the cooling air. An exclusive heater may be arranged as a heating device.

Further, although each of the above embodiments is applied to an inverter device for a hybrid vehicle, as a power converter, a device for DC-DC conversion of electric power or a device for AC-AC conversion of electric power may be acceptable. Further, each of the above embodiments can be applied to not only a reactor of a booster converter but also a reactor for PFC or a smoothing choke coil mounted over a battery charger, a transformer component of an isolated converter, or the like as a magnetic circuit component. Otherwise, a detailed configuration such as a concrete configuration of a cooling device or a cooling channel can be modified variously in addition to the above configurations.

While the present disclosure has been described with reference to embodiments thereof, it is to be understood that the disclosure is not limited to the embodiments and constructions. The present disclosure is intended to cover various modification and equivalent arrangements. In addition, the various combinations and configurations, other combinations and configurations, including more, less or only a single element, are also within the spirit and scope of the present disclosure.

The invention claimed is:

1. A temperature regulating device for a magnetic circuit component, the device regulating temperature of the magnetic circuit component that is incorporated in a power converter and includes a magnetic core and a coil wound around the magnetic core and comprising:
    a cooling device that cools the magnetic circuit component;
    a temperature estimation device that estimates a temperature of the magnetic circuit component;
    a target temperature determination device that determines a target temperature of the magnetic circuit component, at which a loss of the magnetic circuit component is lowered, based on a relationship between temperature and loss of the magnetic circuit component; and
    a cooling suppressor that, when the temperature of the magnetic circuit component estimated by the temperature estimation device is equal to or lower than a predetermined temperature lower than the target temperature, suppresses the cooling of the magnetic circuit component by the cooling device so that the temperature of the magnetic circuit component reaches the target temperature.

2. The temperature regulating device according to claim 1, wherein the target temperature determination device sets the target temperature of the magnetic circuit component at a temperature corresponding to the lowest loss of the magnetic circuit component or its vicinity temperature based on a relationship between temperature and loss of the magnetic core of the magnetic circuit component or the relationship between temperature and loss of the entire magnetic circuit component measured beforehand.

3. The temperature regulating device according to claim 1, wherein:
    the cooling device is configured to cool the magnetic circuit component by flowing cooling fluid through a cooling channel; and
    the cooling suppressor is configured to suppress the cooling of the magnetic circuit component by blocking or reducing the flow of cooling fluid through the cooling channel.

4. The temperature regulating device according to claim 1, wherein:
    the cooling device includes a cooling member placed near the magnetic circuit component; and
    the cooling suppressor is configured to suppress the cooling of the magnetic circuit component by physically separating the magnetic circuit component from the cooling member.

5. The temperature regulating device according to claim 1, wherein:
    the power converter includes:
        a module incorporating a semiconductor element; and
        a module cooling device that cools the module;
    the cooling device and the module cooling device are provided to be connected to a cooling channel; and
    the cooling suppressor is configured to suppress the cooling of the magnetic circuit component by controlling the cooling channel on the cooling device side.

6. The temperature regulating device according to claim 1, further comprising a heating device that, when the temperature of the magnetic circuit component estimated by the temperature estimation device is equal to or lower than the predetermined temperature lower than the target temperature, heats the magnetic circuit component so that the temperature of the magnetic circuit component reaches the target temperature.

7. The temperature regulating device according to claim 6, wherein:
    the power converter is placed in a vehicle; and
    the heating device is configured to heat the magnetic circuit component by using exhaust heat or combustion heat of the vehicle.

8. The temperature regulating device according to claim 1, wherein:
    the cooling device includes:
        a core cooling part that cools the magnetic core of the magnetic circuit component; and
        a coil cooling part that cools the coil; and
    the cooling suppressor is configured to suppress the cooling of the magnetic circuit component by the core cooling part.

* * * * *